United States Patent [19]
Lin

[11] Patent Number: 6,007,950
[45] Date of Patent: Dec. 28, 1999

[54] STRUCTURE OF A PHASE SHIFTING MASK AND METHOD OF FABRICATING THE SAME

[75] Inventor: Benjamin Szu-Min Lin, Chiayi, Taiwan

[73] Assignee: United Microelectronics Corp, Hsinchu, Taiwan

[21] Appl. No.: 09/084,765

[22] Filed: May 26, 1998

[30] Foreign Application Priority Data

May 1, 1998 [TW] Taiwan ................................. 87106763

[51] Int. Cl.⁶ ...................................................... G03F 9/00
[52] U.S. Cl. ................................................................ 430/5
[58] Field of Search ............................. 430/5, 322, 324; 427/523; 378/35

[56] References Cited

U.S. PATENT DOCUMENTS

| | | | |
|---|---|---|---|
| 5,217,830 | 6/1993 | Lowrey | 430/5 |
| 5,459,002 | 10/1995 | Alpay et al. | 430/5 |
| 5,679,483 | 10/1997 | Maurer | 430/5 |
| 5,897,976 | 4/1999 | Carcia et al. | 430/5 |

*Primary Examiner*—S. Rosasco
*Attorney, Agent, or Firm*—Christie, Parker & Hale, LLP

[57] ABSTRACT

A method for fabricating an alternating phase shifting mask includes a transparent substrate, a number of oblique layers formed on the transparent substrate, and a number of embedded phase shift layers inside the transparent substrate. Then, a photolithography process is applied to form a photoresist layer on the transparent substrate corresponding to a desired pattern and, therefore, exposing a portion of the transparent substrate. Then, an ion implantation process utilizing the photoresist layer as a mask is applied to form the embedded phase shift layers and the photoresist layer is removed after ion implantation. The embedded phase shift layers are formed in alternating positions in the transparent portion between the oblique layers.

8 Claims, 2 Drawing Sheets

STRUCTURE OF A PHASE SHIFTING MASK AND METHOD OF FABRICATING THE SAME

CROSS-REFERENCE TO RELATED APPLICATION

This application claims the priority benefit of Taiwan application serial no. 87106763, filed May 1, 1998, the full disclosure of which is incorporated herein by reference.

BACKGROUND OF THE INVENTION

1. Field of the Invention

This invention relates to a structure of a phase shifting mask (PSM) and fabricating the PSM, and more particularly to an alternating PSM in which use of a semiconductor fabricating procedure is combined with ion implantation technology.

2. Description of Related Art

Currently, application of photolithography in the fabricating procedure on a wafer usually includes a PSM, which can increase the resolution of a pattern transferred from the PSM. Generally, there are two common types of PSM; one is a strong PSM and the other one is a weak PSM. The strong PSM further includes a Levenson PSM and an alternating PSM, and the weak PSM further includes a half-tone PSM, a rim PSM and an attenuated PSM.

The alternating PSM is characterized by having a phase shift layer, which appears in alternating positions. The phase shift layer can invert the phase of a light wave when the light travels through it so that light with an inverted phase can interfere with light without an inverted phase. Because of the interference of the light, the contrast of light intensity is increased. Thus, the alternating PSM is commonly used in the conventional technology.

FIG. 1 is a sectional plot schematically illustrating a conventional alternating PSM. Referring to FIG. 1, a transparent substrate 10 including quartz has a number of opaque layers 12 separately covering surface portions of the transparent substrate 10 so that there are a number exposed portions of transparent substrate 10 for transferring the desired pattern. Then, at every other position between the opaque regions 12, a number of phase shift layers 14 cover the transparent substrate 10. The method of forming the phase shift layers 14 usually uses a transparent layer (not shown) formed over the transparent substrate 10 and defines the transparent layer by etching to form the phase shift layers 14.

When the light, which is also a kind of electromagnetic plane wave, is incident on the transparent substrate 10, the light travelling through the transparent part has interfered with the light travelling through the opaque part. FIG. 2A schematically shows the distribution of the electric field (E) versus the position of the transparent substrate determined in FIG. 1 after light has traveled through the alternating phase shifting mask. Referring to FIG. 1 and FIG. 2A, the electric field (E) correlates to the location of the opaque layers 12 and the phase shift layers 14 on the transparent substrate 10. The Emax and Emin in FIG. 2A are the maximum and the minimum of the E distribution corresponding to the transparent part of the transparent substrate 10 and the phase shift layers, respectively. The Emin is a negative quantity.

FIG. 2B schematically shows the distribution of the intensity of light versus the position of the transparent substrate determined in the FIG. 1. Referring to FIGS. 1, 2A and 2B, the intensity (I) of light correlates to the location of the opaque layers 12 and the phase shift layers 14 on the transparent substrate 10. The intensity I also correlates to the electric field with a relation of I $E^2$ so that the maximum intensity I, as indicated by Imax, appears at the Emax or Emin.

For a conventional alternating PSM, as is widely used in photolithography and etching, the critical dimension is below 0.25 $\mu$m, and is especially suitable for transferring line/space pattern. Because the phase shift layer 14 is formed by etching, some drawbacks are inevitable, for example, defects appear due to poor etching selectivity or bias of transferring line/space pattern.

SUMMARY OF THE INVENTION

It is therefore an objective of the present invention to provide a structure of an alternating phase shifting mask (PSM) which can be fabricated by using an ion implantation process for forming the phase shift layer instead of the conventional etching process. In this manner, the defects induced by poor etching selectivity or bias of transferring line/space pattern during etching process can be effectively avoided. The quality of the alternating PSM can, therefore, be improved.

In accordance with the foregoing and other objectives of the present invention, the structure of the alternating phase shifting mask (PSM) includes a transparent substrate, a number of opaque layers formed on the transparent substrate, and a number of embedded phase shift layers. The transparent substrate preferably includes quartz and the opaque layers preferably include Cr. Then, a photolithography process is applied to form a photoresist layer on the transparent substrate according to a desired pattern and thereby exposes a portion of the transparent substrate. Then, an ion implantation process using the photoresist layer as a mask is applied to form the embedded phase shift layers and the photoresist layer is removed after ion implantation. The embedded phase shift layers are formed in alternating positions in the transparent portion between the opaque layers.

In conclusion, the invention providing a method for fabricating the alternating PSM is characterized as follows:

1. An ion implantation process is used to form the phase shifter layers and replaces the conventional etching process. Therefore, the defects inherent in the fabricating processes such as poor etching selectivity and bias of transferring line/space patterns can be effectively avoided.

2. The embedded phase shift layers in the invention are formed inside the transparent substrate.

3. The density and the energy of the ion source and the doped depth of the doped regions are adjustable so that there is more flexibility for producing desired line/space patterns.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The characteristics of the invention involve an implantation process that replaces the conventional etching process in fabricating an alternating PSM. This can avoid the conventional problems of, for example, poor etching selectivity or bias in transferring the line/space pattern.

Figure 3A:
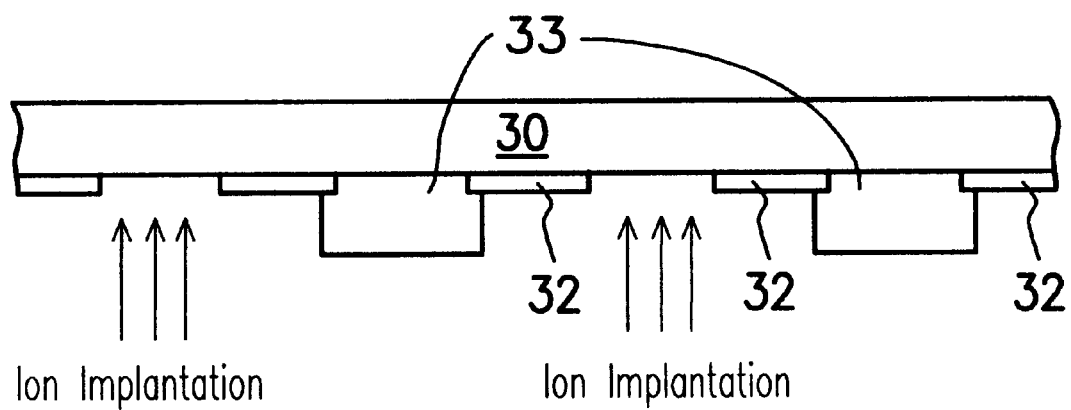
FIG. 3A and FIG. 3B are schematic sectional plots illustrating a procedure for fabricating an alternating phase shifting mask according to the preferred embodiment of the invention.
Figure 3B:
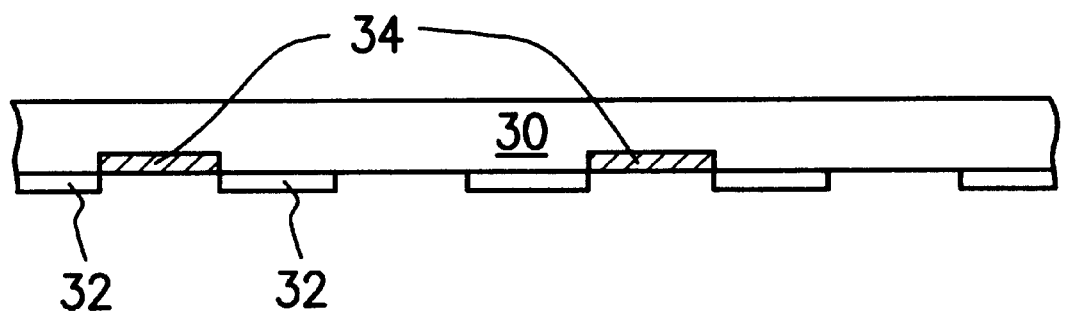

FIG. 3A and FIG. 3B are sectional plots schematically illustrating a procedure for fabricating the alternating phase shifting masks, according to the preferred embodiment of the invention.

Referring to FIG. 3A, a number of opaque layers 32 are separately formed on a transparent substrate 30. The transparent substrate 30 includes material such as quartz and the opaque layers include opaque materials such as Chromium (Cr). The opaque layers 32 partially cover the transparent substrate 30 so that a number of transparent portions of the transparent substrate 30 remain for transferring the line/space pattern. Next, at every other position between the opaque layers, a number of photoresist layers 33 are formed over the transparent substrate 30.

Referring to FIG. 3A and FIG. 3B, an ion implantation process is performed on the transparent portions of the transparent substrate 30 as indicated by arrows in FIG. 3A by using the photoresist layers 33 as a mask. Therefore, a number of doped regions 34 are formed with either p-type or n-type ion sources. The doped regions 34 act as a number of embedded phase shift layers 34, which is one of the characteristics of the invention. The embedded phase shift layers are formed inside the transparent substrate 30. This is different from the conventional phase shift layers, which are formed externally. Moreover, the density and the energy of the ion source and the doped depth are adjustable so that the flexibility is increased. After the removing the photoresist layers 33, an alternating PSM according to the invention is formed.

Figure 1:
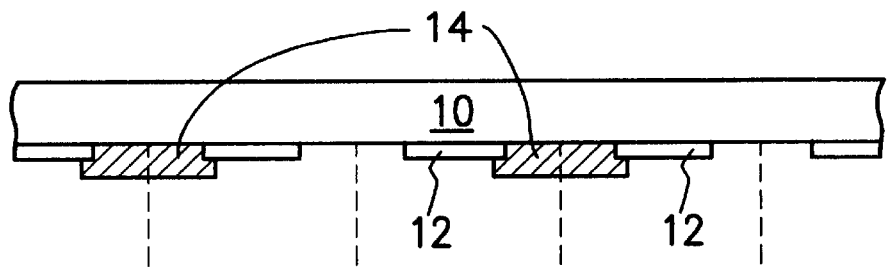
FIG. 1 is schematic sectional view illustrating a conventional alternating phase shifting mask.
Figure 2A:
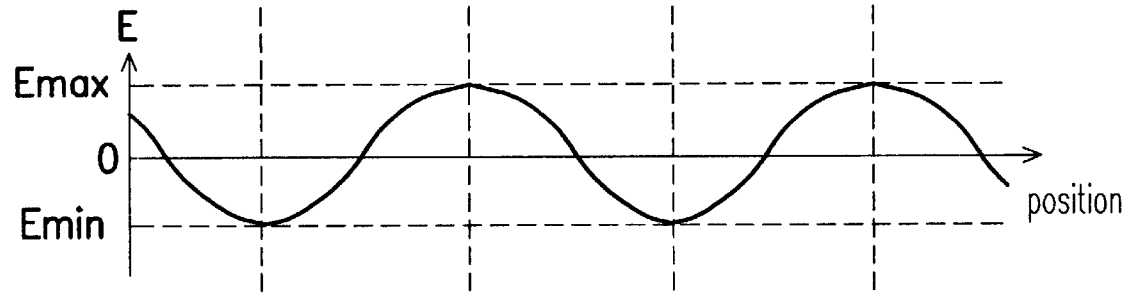
FIG. 2A schematically illustrates distribution of the electric field versus the position of the transparent substrate determined in the FIG. 1 after light travels through the alternating phase shifting mask.
Figure 2B:
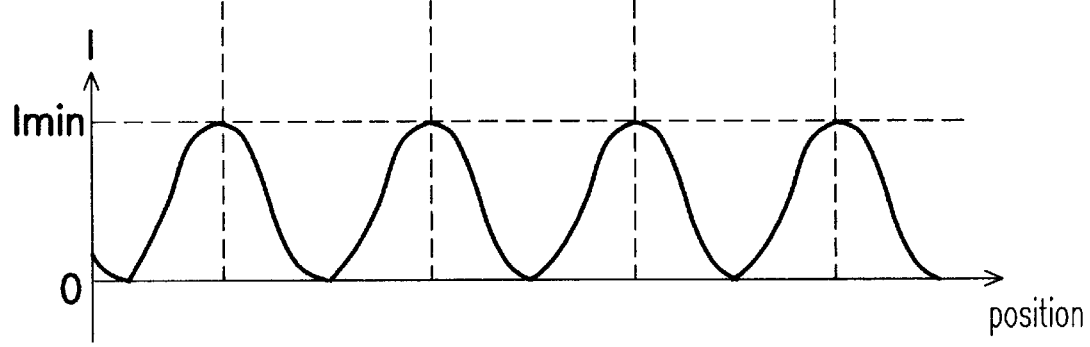
FIG. 2B schematically shows the distribution of the intensity of light versus the position of the transparent substrate determined in the FIG. 1.

When a light, which is a kind of electromagnetic plane wave, is incident on the alternating PSM, part of the light is blocked by the opaque layers 32, part of the light can pass through the transparent portions of the transparent substrate 30 and rest part of the light can pass through the doped regions 34 with a phase that is about 180° different from the previous passing light. Therefore, interference occurs between these two parts of passing light. As in the previous descriptions of FIGS. 2A and 2B, since the intensity of the light (I) is proportional to the squared electric field, $E^2$, the intensity I has a sinusoidal distribution. The interference is a typical physics phenomenon for the alternating PSM, but the alternating PSM of the invention has more flexibility in forming the doped regions 34 to produce desired line/space patterns.

In conclusion, the invention providing a method for fabricating the alternating PSM has been characterized as follows:

1. An ion implantation process is used to form the phase shifter layers 34 that replace the conventional etching process. Therefore, the defects of fabricating processes such as poor etching selectivity and bias when transferring line/space patterns can be effectively avoided.

2. The embedded phase shift layers 34 in the invention are formed inside the transparent substrate 30.

3. The density and the energy of the ion source and the doped depth of the doped regions 34 are adjustable so that there is greater flexibility for producing desired line/space patterns is increased.

The invention has been described using exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabrication of an alternating phase shifting mask, the method comprising:

providing a transparent substrate;

forming a patterned opaque layer on the transparent substrate;

forming a patterned photoresist layer over the patterned opaque layer to expose a portion of the transparent substrate after the patterned opaque layer is formed;

applying an ion implantation process by using the photoresist as a mask to form an embedded phase shift layer in a portion of the transparent substrate exposed by the patterned photoresist layer and the patterned opaque layer after the patterned photoresist layer is formed; and removing the photoresist layer.

2. The method of claim 1, wherein the transparent substrate comprises quartz.

3. The method of claim 1, wherein the opaque layer comprises chromium (Cr).

4. The method of claim 1, wherein embedded phase shift layer comprises a doped region with dopant.

5. The structure of claim 1, wherein the opaque layer comprises a discrete distribution in a sectional view of the transparent substrate so that a portion of the transparent substrate is exposed.

6. The structure of claim 5, wherein the embedded phase shift layer is located in the exposed portion of the transparent substrate.

7. The structure of claim 6, wherein the embedded phase shift layer appears in alternating positions in the exposed portion of the transparent substrate.

8. A structure of an alternating phase shifting mask, the structure comprising:

a transparent substrate;

a patterned opaque layer formed on the transparent substrate; and an embedded phase shift layer formed inside the transparent substrate exposed by application of an ion implantation process using the patterned opaque layer as a mask, after the patterned opaque layer is formed.

* * * * *